(12) United States Patent
Jaiswal

(10) Patent No.: US 12,347,595 B2
(45) Date of Patent: Jul. 1, 2025

(54) MAGNETORESISTANCE ELEMENT INCLUDING A SKYRMION LAYER AND A VORTEX LAYER THAT ARE MAGNETICALLY COUPLED TO EACH OTHER

(71) Applicant: Allegro MicroSystems, LLC, Manchester, NH (US)

(72) Inventor: Samridh Jaiswal, London (GB)

(73) Assignee: Allegro MicroSystems, LLC, Manchester, NH (US)

( * ) Notice: Subject to any disclaimer, the term of this patent is extended or adjusted under 35 U.S.C. 154(b) by 276 days.

(21) Appl. No.: 18/333,680

(22) Filed: Jun. 13, 2023

(65) Prior Publication Data

US 2024/0420878 A1     Dec. 19, 2024

(51) Int. Cl.
*G01R 33/09*     (2006.01)
*H01F 10/32*     (2006.01)

(52) U.S. Cl.
CPC ....... *H01F 10/3254* (2013.01); *G01R 33/093* (2013.01); *G01R 33/098* (2013.01); *H01F 10/3268* (2013.01)

(58) Field of Classification Search
CPC ............. H01F 10/3254; H01F 10/3268; G01R 33/093; G01R 33/098
See application file for complete search history.

(56) References Cited

U.S. PATENT DOCUMENTS

| | | | |
|---|---|---|---|
| 5,216,560 A | 6/1993 | Brug et al. | |
| 5,561,368 A | 10/1996 | Dovek et al. | |
| 6,055,136 A | 4/2000 | Gill et al. | |
| 6,166,539 A | 12/2000 | Dahlberg et al. | |
| 6,490,140 B1 | 12/2002 | Mao et al. | |
| 6,501,678 B1 | 12/2002 | Lenssen et al. | |

(Continued)

FOREIGN PATENT DOCUMENTS

| | | |
|---|---|---|
| EP | 2926349 | 4/2019 |
| JP | 2018-037613 A | 3/2018 |

(Continued)

OTHER PUBLICATIONS

Guang et al.; "Electrical Detection of Magnetic Skyrmions in a Magnetic Tunnel Junction"; Advanced Electronic Materials; vol. 9; Jan. 2023; 8 Pages.

(Continued)

*Primary Examiner* — Alvaro E Fortich

(74) *Attorney, Agent, or Firm* — Daly, Crowley, Mofford & Durkee, LLP

(57) ABSTRACT

According to one aspect of the present disclosure, a magnetoresistance (MR) element includes a free layer. In some embodiments, the free layer also includes a vortex layer comprising a vortex and a skyrmion layer magnetically coupled to the vortex layer. In some embodiments, in the skyrmion layer is configured to form skyrmions that reduce annihilation of the vortex thereby increasing a linear response range of the MR element. In some embodiments, the MR element is a tunneling magnetoresistance element or a giant magnetoresistance element. In some embodiments, the MR element includes a barrier layer, wherein the vortex layer is closer to the barrier layer than the skyrmion layer.

51 Claims, 7 Drawing Sheets

(56) References Cited

U.S. PATENT DOCUMENTS

| | | |
|---|---|---|
| 7,064,937 B2 | 6/2006 | Wan et al. |
| 7,259,545 B2 | 8/2007 | Stauth et al. |
| 7,838,133 B2 | 11/2010 | Zhang et al. |
| 8,269,491 B2 | 9/2012 | Cummings et al. |
| 9,046,562 B2 | 6/2015 | Cummings et al. |
| 9,465,056 B2 | 10/2016 | Han et al. |
| 9,529,060 B2 | 12/2016 | Fermon et al. |
| 9,812,637 B2 | 11/2017 | Fermon et al. |
| 10,060,880 B2 | 8/2018 | Chen et al. |
| 10,734,443 B2 | 8/2020 | Lassalle-Balier et al. |
| 10,753,989 B2 | 8/2020 | Campiglio et al. |
| 2005/0068683 A1 | 3/2005 | Gill |
| 2006/0218775 A1 | 10/2006 | Carey et al. |
| 2007/0121249 A1 | 5/2007 | Parker |
| 2008/0258721 A1 | 10/2008 | Guo et al. |
| 2009/0027048 A1 | 1/2009 | Sato et al. |
| 2009/0237075 A1 | 9/2009 | Koss |
| 2010/0007344 A1 | 1/2010 | Guo et al. |
| 2010/0142101 A1 | 6/2010 | Sato et al. |
| 2010/0277971 A1 | 11/2010 | Slaughter et al. |
| 2011/0062537 A1 | 3/2011 | Oh et al. |
| 2011/0069413 A1 | 3/2011 | Maat et al. |
| 2012/0070693 A1* | 3/2012 | Abarra ............... G11B 5/3909 428/811.2 |
| 2013/0140658 A1 | 6/2013 | Yamane et al. |
| 2014/0175574 A1 | 6/2014 | Watts et al. |
| 2014/0250244 A1 | 9/2014 | Song et al. |
| 2015/0022196 A1 | 1/2015 | Hebiguchi et al. |
| 2015/0177286 A1 | 6/2015 | Fuji et al. |
| 2015/0192648 A1 | 7/2015 | Campiglio et al. |
| 2015/0333254 A1 | 11/2015 | Liu et al. |
| 2016/0218277 A1 | 7/2016 | Yano et al. |
| 2016/0359103 A1 | 12/2016 | Fermon et al. |
| 2017/0314969 A1 | 11/2017 | Ausserlechner et al. |
| 2019/0206466 A1* | 7/2019 | Schabes ............... H10N 50/01 |
| 2019/0206934 A1 | 7/2019 | Kim et al. |
| 2019/0219616 A1 | 7/2019 | Cadugan et al. |
| 2019/0219643 A1 | 7/2019 | Cadugan et al. |
| 2020/0033424 A1 | 1/2020 | Campiglio et al. |
| 2021/0096195 A1 | 4/2021 | Muehlenhoff et al. |
| 2021/0382122 A1 | 12/2021 | Saito et al. |
| 2021/0389393 A1 | 12/2021 | Lassalle-Balier et al. |
| 2022/0036933 A1* | 2/2022 | Kim .................. H10B 61/00 |
| 2022/0181061 A1* | 6/2022 | Roiz-Wilson ........ H01F 10/329 |
| 2022/0230669 A1* | 7/2022 | Buchanan ............ G11C 11/161 |

FOREIGN PATENT DOCUMENTS

| | | |
|---|---|---|
| TW | I 513993 B | 12/2015 |
| TW | I 6333321 B | 8/2018 |
| WO | WO 2018/012953 A1 | 1/2018 |

OTHER PUBLICATIONS

Taiwan Office Action (with English Translation) dated Oct. 29, 2024 for Taiwan Application No. 113112474; 17 Pages.
Search Report and Written Opinion dated Jul. 4, 2024 PCT Application No. PCT/US2024/018802, 13 pages.
U.S. Appl. No. 18/333,765, filed Jun. 13, 2023, Campiglio, et al.
U.S. Appl. No. 17/806,336, filed Jun. 10, 2022, Lassalle-Balier et al.
U.S. Preliminary Amendment filed on Oct. 19, 2018 for U.S. Appl. No. 16/113,321; 7 Pages.
U.S. Non-Final Office Action dated Feb. 7, 2020 for U.S. Appl. No. 16/113,321; 16 Pages.
Response to U.S. Non-Final Office Action dated Feb. 7, 2020 for U.S. Appl. No. 16/113,321; Response filed Apr. 10, 2020; 12 Pages.
U.S. Notice of Allowance dated May 14, 2020 for U.S. Appl. No. 16/113,321; 15 Pages.
U.S. Preliminary Amendment filed on Nov. 1, 2019 for U.S. Appl. No. 16/507,538; 12 Pages.
U.S. Second Preliminary Amendment filed on Nov. 4, 2019 for U.S. Appl. No. 16/507,538; 12 Pages.
U.S. Notice of Allowance dated May 4, 2020 for U.S. Appl. No. 16/507,538; 10 Pages.
Taiwan 1$^{st}$ Office Action (with English Translation) dated May 28, 2020 for Taiwan Application No. 108127885; 20 Pages.
Response (with Machine English Translation) to Taiwan Office Action dated May 28, 2020 for Taiwan Application No. 108127885; Response filed Aug. 18, 2020; 19 Pages.
Taiwan Allowance Decision (with English Translation) dated Oct. 29, 2020 for Taiwan Application No. 108127885; 3 Pages.
Extended European Search Report (EESR) dated Feb. 23, 2021 for European Application No. 20184390.1; 9 Pages.
Taiwan Office Action (with English Translation) dated Dec. 1, 2021 for Taiwan Application No. 110101393; 9 Pages.
Response (with Machine English Translation) to Taiwan Office Action dated Dec. 1, 2021 for Taiwan Application No. 110101393; Response filed Feb. 9, 2022; 38 Pages.
Taiwan Allowance Decision (with English Translation) dated May 2, 2022 for Taiwan Application No. 110101393; 3 Pages.
U.S. Notice of Allowance dated Aug. 22, 2019 for U.S. Appl. No. 15/869,620; 11 Pages.
Allegro MicroSystems, LLC, "High Sensitivity, 1 MHz GMR-Based Current Sensor IC in Space-Saving Low Resistance QFN Package;" ACS70331; Dec. 1, 2017; 22 Pages.
Response (with English Translation) to Taiwan Office Action dated Oct. 29, 2024 for Taiwan Application No. 113112474; Response Filed Jan. 22, 2025; 57 Pages.
Taiwan Allowance Decision (with English Translation) dated Mar. 3, 2025 for Taiwan Application No. 113112474; 3 Pages.

* cited by examiner

MAGNETORESISTANCE ELEMENT INCLUDING A SKYRMION LAYER AND A VORTEX LAYER THAT ARE MAGNETICALLY COUPLED TO EACH OTHER

BACKGROUND

A magnetic field sensing element describes a variety of electronic elements that can sense a magnetic field. One such magnetic field sensing element is a magnetoresistance (MR) element. An MR element has a resistance that changes in relation to changes in a magnetic field experienced by the MR element. One such example of a MR element is a tunnel magnetoresistance (TMR) element. Another example is a giant magnetoresistance (GMR) element. Magnetic-field sensors may include bridges (e.g., a Wheatstone bridge). The bridges typically include four or more MR elements. MR elements in a bridge may include TMR elements. Each TMR element may include a plurality of pillars. Some MR elements may have a linear response range such that changes in resistance of the MR element is linear to changes in an applied magnetic field.

MR elements are used in magnetic field sensors. Magnetic field sensors are used in a variety of applications, including, but not limited to, an angle sensor that senses an angle of a direction of a magnetic field; a current sensor that senses a magnetic field generated by a current carried by a current-carrying conductor; a magnetic switch that senses the proximity of a ferromagnetic object; a rotation detector that senses passing ferromagnetic articles, for example, magnetic domains of a ring magnet or a ferromagnetic target (e.g., gear teeth) where the magnetic field sensor is used in combination with a back-biased or other magnet; a magnetic field sensor that senses a magnetic field density of a magnetic field, a linear sensor that senses a position of a ferromagnetic target; and so forth.

SUMMARY

According to one aspect of the present disclosure, a magnetoresistance (MR) element includes a free layer. In some embodiments, the free layer includes a vortex layer comprising a vortex and a skyrmion layer magnetically coupled to the vortex layer. In some embodiments, the skyrmion layer is configured to form skyrmions that reduce annihilation of the vortex thereby increasing a linear response range of the MR element.

According to another aspect of the present disclosure, a magnetic field sensor includes a bridge comprising at least one MR element. In some embodiments, the at least one MR element includes a free layer. In some embodiments, the free layer includes a vortex layer comprising a vortex and a skyrmion layer on the vortex layer and magnetically coupled to the vortex layer. In some embodiments, the skyrmion layer is configured to form skyrmions that reduce annihilation of the vortex thereby increasing a linear response range of the at least one MR element.

According to another aspect of the present disclosure, a method includes manufacturing a magnetoresistance (MR) element. In some embodiments, the manufacturing includes forming a free layer. In some embodiments, the method includes depositing a vortex layer comprising a vortex and depositing a skyrmion layer on the vortex layer that is magnetically coupled to the vortex layer. In some embodiments, the skyrmion layer is configured to form skyrmions that reduce annihilation of the vortex thereby increasing a linear response range of the MR element.

DESCRIPTION OF THE SEVERAL VIEWS OF THE DRAWINGS

The manner and process of making and using the disclosed embodiments may be appreciated by reference to the figures of the accompanying drawings. It should be appreciated that the components and structures illustrated in the figures are not necessarily to scale, emphasis instead being placed upon illustrating the principals of the concepts described herein. Like reference numerals designate corresponding parts throughout the different views. Furthermore, embodiments are illustrated by way of example and not limitation in the figures, in which.

DETAILED DESCRIPTION

Described herein is a magnetoresistance (MR) element that includes a free layer that includes a skyrmion layer and a vortex layer magnetically coupled to each other. The skyrmion layer enables a linear response range of a MR element to be larger than a traditional MR element that does not include a skyrmion layer. In general, the larger the linear response range the better accuracy of a magnetic field sensor.

Figure 1:
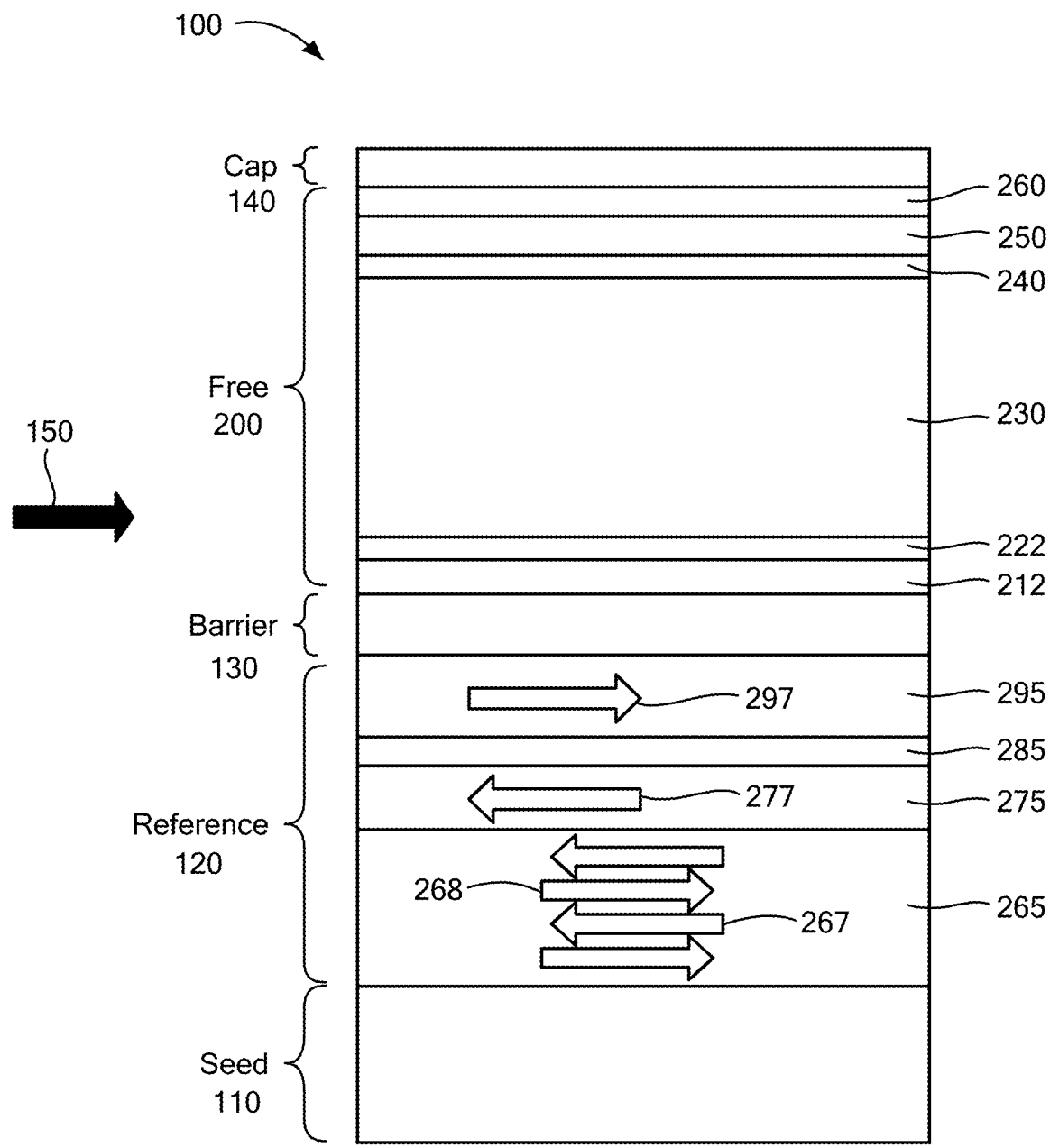
FIG. 1 is a cross-sectional diagram of a tunnel magnetoresistance (TMR) element that includes a skyrmion layer and a vortex layer.

Referring to FIG. 1, an example of a TMR element is a TMR element 100. The TMR element is configured to detect changes in a magnetic field intensity of an external magnetic field. The TMR element 100 may be configured as a single pillar as shown in FIG. 1 or as multiple pillars. The TMR element 100 changes resistance in response to a change in an applied magnetic field 150. While this example describes a TMR element the principles and ideas described herein are not limited to a TMR element but may be applied also to a giant magnetoresistance (GMR) element.

In one example, the TMR element 100 includes a seed layer 110; a reference layer 120 on the seed layer 110; a barrier layer 130 on the reference layer 120; a free layer 200 on the barrier layer 130 (sometimes called an "insulating layer"); and a cap layer 140 on the free layer 200. In one example, the free layer 200 includes a ferromagnetic layer 212, a spacer layer 222, a vortex layer 230, a spacer layer 240, a skyrmion layer 250 magnetically coupled to the vortex layer 230, and a heavy metal layer 260.

In one example, the ferromagnetic layer 212 is cobalt iron boron (CoFeB) having a thickness of 2 nanometers (nm)

±0.25 nm. In one example, the spacer layer 222 is tantalum having a thickness of 0.1 nm±0.025 nm.

Figure 2:
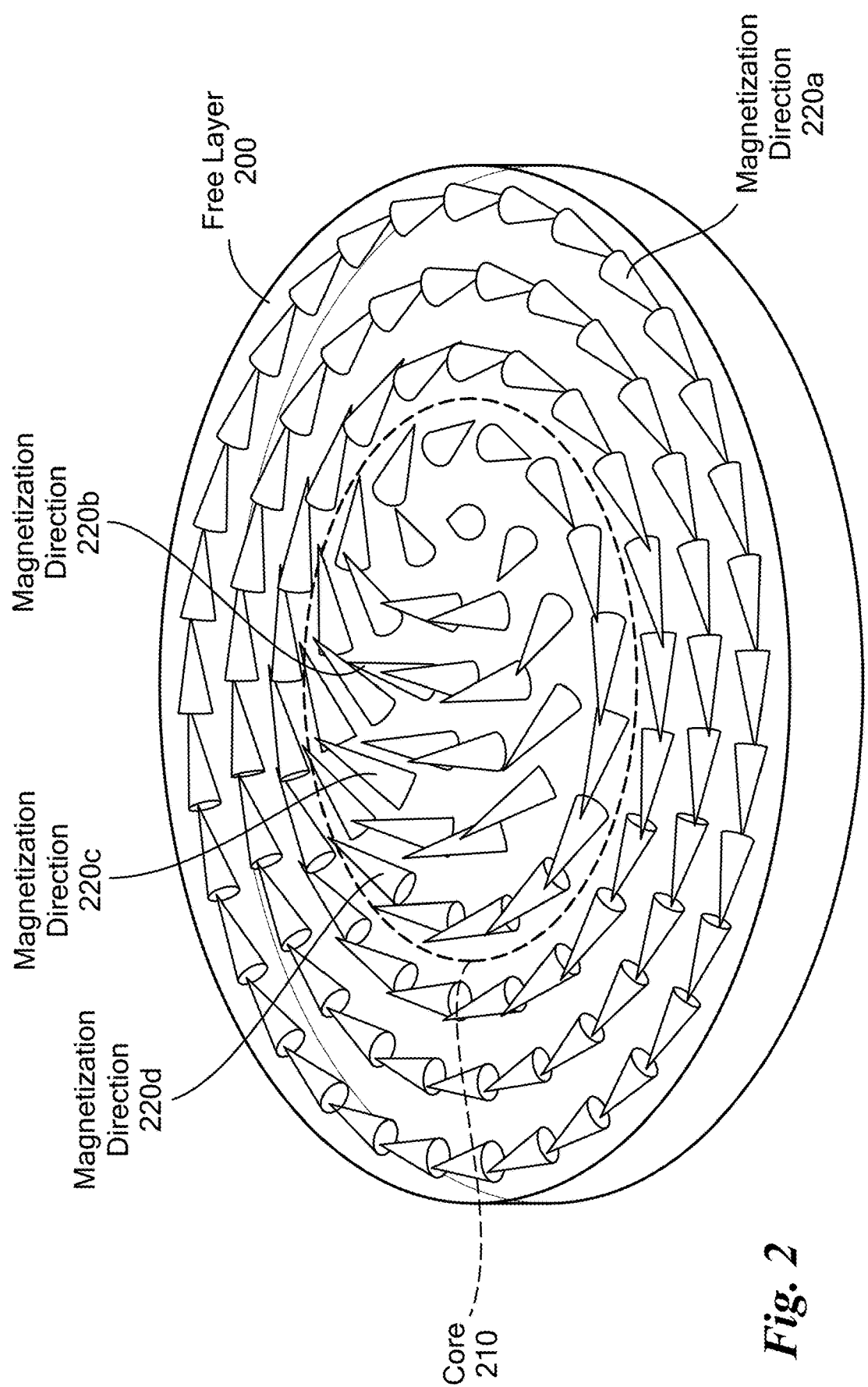
FIG. 2 is a diagram of an example of a vortex layer having a magnetic vortex that includes a core in the center.

The vortex layer 230 includes a vortex as described in FIG. 2. The vortex includes ferromagnetic material. In one example, the vortex layer 230 is nickel iron (NiFe) having a thickness of 50 nm or greater.

The skyrmion layer 250 forms skyrmions. With the magnetic coupling of the skyrmion layer and the vortex layer 230, skyrmions prevent annihilation of a vortex due to edge defects by repelling the vortex away from the edge of the pillar.

The skyrmion layer 250 includes ferromagnetic material. In one example, the skyrmion layer 250 includes cobalt. In one particular example, the skyrmion layer 250 is cobalt iron boron (CoFeB) having a thickness between 0.4 nm to 1.2 nm. The thickness of the skyrmion layer 250 is within the spin-reorientation transition (SRT) of the skyrmion layer material. The thickness of skyrmion layer 250 depends on a deposition tool used to deposit the skyrmion layer 250 and the material composition of the skyrmion layer 250.

The spacer layer 240 is used to adjust the magnetic coupling between the vortex layer 230 and the skyrmion layer 250. For example, a thickness of the spacer layer 240 may be adjusted based on a degree of coupling desired between the vortex layer 230 and the skyrmion layer 250. For example, a thickness of the spacer layer 240 may be reduced to increase the strength of the magnetic coupling and visa-versa. In one example the spacer layer 240 is tantalum having a thickness between 0.1 nm to 1 nm.

The heavy metal layer 260 includes a heavy metal that stabilizes the skyrmions in the skyrmion layer 250. In one example, the heavy metal layer 260 may be tungsten, platinum, iridium, and/or tantalum. The thickness of the heavy metal layer 260 may be greater than 5 nm.

In one example, the seed layer 110 may be disposed or otherwise provided upon a substrate (e.g., a silicon substrate). In one example, the seed layer 110 is a non-magnetic material (e.g., copper nitride (CuN)).

In one example, the reference layer 120 includes an antiferromagnetic layer 265, a ferromagnetic layer 275, a spacer layer 285 and a ferromagnetic layer 295. The antiferromagnetic layer 265 is called a pinning layer and includes magnetization directions 267, 268 that are antiparallel to each other. In one example, the antiferromagnetic layer 265 is platinum manganese, iridium manganese and so forth having a thickness between 7 nm to 18 nm.

In one example, the ferromagnetic layer 275 includes cobalt and has a magnetization direction 277. The ferromagnetic layer 275 is called a pinned layer as the magnetization direction 277 is pinned by the antiferromagnetic layer 265. In one particular example, the ferromagnetic layer 275 is cobalt iron having a thickness of 2.3 nm±0.25 nm.

The spacer layer 285 includes a nonmagnetic material such a metal, for example. Ruthenium is well suited for the spacer layer 285 because ruthenium allows antiferromagnetic or ferromagnetic coupling (also called Ruderman Kittel Kasuya Yoshida or RKKY coupling) between surrounding layers, according to the thickness of the ruthenium. RKKY coupling decreases and switches between a maximum antiferromagnetic coupling and a maximum ferromagnetic coupling as the thickness of the spacer layer 285 is increased. In essence, the ruthenium material permits coupling through the ruthenium material, as opposed to in spite of the ruthenium material. In one particular example, the spacer layer 285 is ruthenium having a thickness of 0.8 nm±0.02 nm.

In one example, the ferromagnetic layer 295 includes cobalt. The ferromagnetic layer 295 has a magnetization direction 297 and is the reference direction of the TMR element 100. The reference direction is the direction the TMR element 100 has the most changes in resistivity with changes in a detected magnetic field. In one particular example, the ferromagnetic layer 295 is cobalt iron boron having a thickness of 1.0 nm±0.25 nm. The magnetization direction 297 may be parallel or antiparallel to the magnetization direction 277 depending on the thickness of the spacer layer 285.

In one example, the barrier layer 130 may be magnesium oxide (MgO) having a thickness of 2 nm+/−0.25 nm thick. The cap layer 140 may be made from a nonmagnetic or diamagnetic material (e.g., Ta, Cu or Ru) and may be about 10 nm+/−0.5 nm thick.

Referring to FIG. 2, a TMR formed as a pillar may include a free layer 200 that has a magnetic vortex. For example, the magnetic vortex has magnetization directions (e.g., a magnetization direction 220a, magnetization direction 220b, magnetization direction 220c, magnetization direction 220d) that loop around the free layer 200.

The free layer 200 is a magnetic disk. Exchange energy and demagnetizing energy are two key phenomena in magnetic disks. Exchange energy increases energy cost when the magnetization is not homogeneous across the magnetic material of the magnetic disk, while the demagnetizing energy increases energy cost when the magnetization directions point outside of the magnetic disk. Exchange energy is a volume effect term while demagnetizing energy is an edge effect term.

When the magnetic disk of the free layer 200 has a large diameter and is thin, the magnetization directions tend to be uniform and in the plane of the free layer 200 across the magnetic disk. There is a cost of demagnetizing energy as magnetization directions point outside the magnetic disk. This energy cost is located on the edges of the magnetic disk. Thus, if the magnetic disk has a large enough diameter, then the volume effect (i.e., exchange energy) is more important than an edge effect (i.e., demagnetizing energy). Therefore, it is less expensive to have the magnetization homogeneous in a plane.

The magnetic vortex has a core 210 (sometimes called a "magnetic vortex core"). The magnetization directions start to become more and more non-planar the closer to the center of the core 170. That is, the angle of the magnetization direction with respect to the surface of the free layer 200 increases the closer to the center of the core 210 a magnetization direction is located. For example, an angle of the magnetization direction 220b with respect to the surface of the free layer 200 is higher than the angle of the magnetization direction 220a with respect to the surface of the free layer 200. An angle of the magnetization direction 220c with respect to the surface of the free layer 200 is higher than the angle of the magnetization direction 220b with respect to the surface of the free layer 200. An angle of the magnetization direction 220d with respect to the surface of the free layer 200 is higher than the angle of the magnetization direction 220c with respect to the surface of the free layer 200.

When an external magnetic field is applied to the free layer 200 that includes a magnetic vortex, the core 210 of the magnetic vortex moves to favor magnetization along the applied magnetic field. However, if the applied magnetic field is too large, the core is pushed out of the magnetic disk and the magnetization directions in the magnetic disk becomes almost homogeneous. This is referred to as vortex annihilation. The external magnetic field must be decreased down to a nucleation magnetic field level before a vortex core can be nucleated inside the magnetic disk.

Vortex structures are often used to manipulate and effectively increase the linear range by reducing the size of the pillar. Reducing the pillar diameter exponentially increases the linear range. However, as the pillar diameter is shrunk to 1 micron or less, edge effects from the boundaries of the TMR pillar start to affect the response curve. A free layer comprising only vortex like structures can get locally pinned at the edges of the pillar due to edge defects present naturally in the manufacturing process. Edge effects can increase the coercivity, meaning the edge effects decrease the ability of the ferromagnetic material to withstand an external magnetic field without becoming demagnetized. This increase in coercivity leads to hysteresis in the transfer curve and makes the device unusable as an accurate linear sensor.

Figure 3:
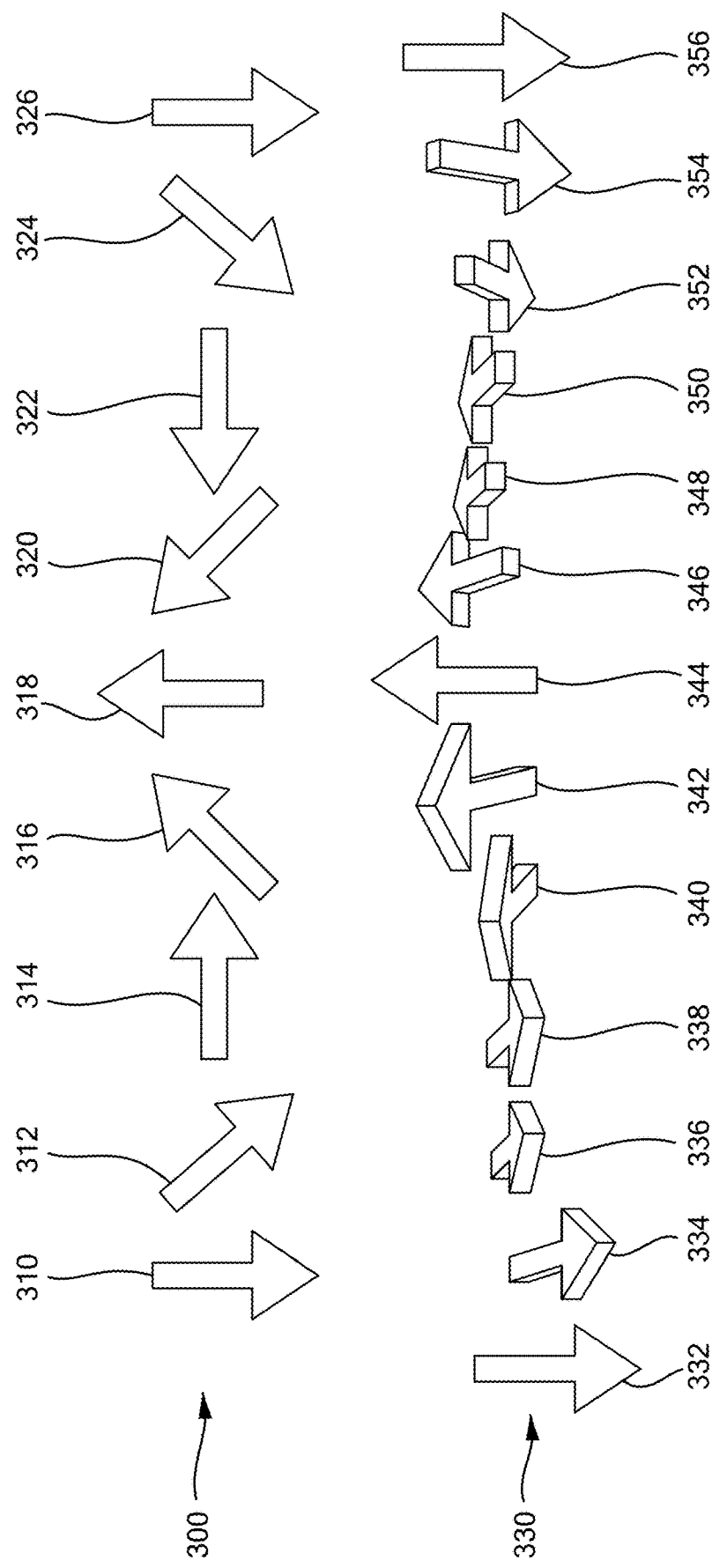
FIG. 3 is a diagram of a Néel skyrmion structure and a Bloch skyrmion structure.

FIG. 3 depicts a diagram of a Néel skyrmion layer 300 and a Bloch skyrmion layer 330. The skyrmion is a magnetic particle comprising multiple magnetic directions arranged in a particular fashion in both out-of-plane and in-plane directions. The way in which the magnetic directions are oriented can be used to categorize the skyrmion as a Neel skyrmion or Bloch skyrmion. The surface of the skyrmion layer is not shown for ease of reference. Owing to its unique topological protection given by the skyrmions' geometry and configuration, the magnetic directions (or magnetic spins) repel away from edges of the TMR pillar.

The Néel skyrmion layer 300 has Néel skyrmions with magnetic directions 310, 312, 314, 316, 318, 320, 322, 324, 326 that rotate in plane from the edge to the core. From a cross-sectional side view of the TMR element, the magnetic directions rotate in the plane that is perpendicular to the surface of the TMR element (i.e., in the in-plane direction). That is, the angle of the magnetization directions 310, 312, 314, 316, 318, 320, 322, 324, 326 with respect to the surface of the skyrmion layer 300 spin in-plane towards the center of the core.

The Bloch skyrmion layer 330 has magnetic directions 332, 334, 336, 338, 340, 342, 344, 346, 348, 350, 352, 354, 356 that rotate out of plane from the edge to the core. From a cross-sectional side view of the TMR element, the magnetic directions rotate in a plane parallel to the surface of the TMR element (i.e., in the out of plane direction). That is, the angle of the magnetization directions 332, 334, 336, 338, 340, 342, 344, 346, 348, 350, 352, 354, 356 with respect to the surface of the skyrmion layer 330 spin out of plane towards the center of the core.

Figure 4:
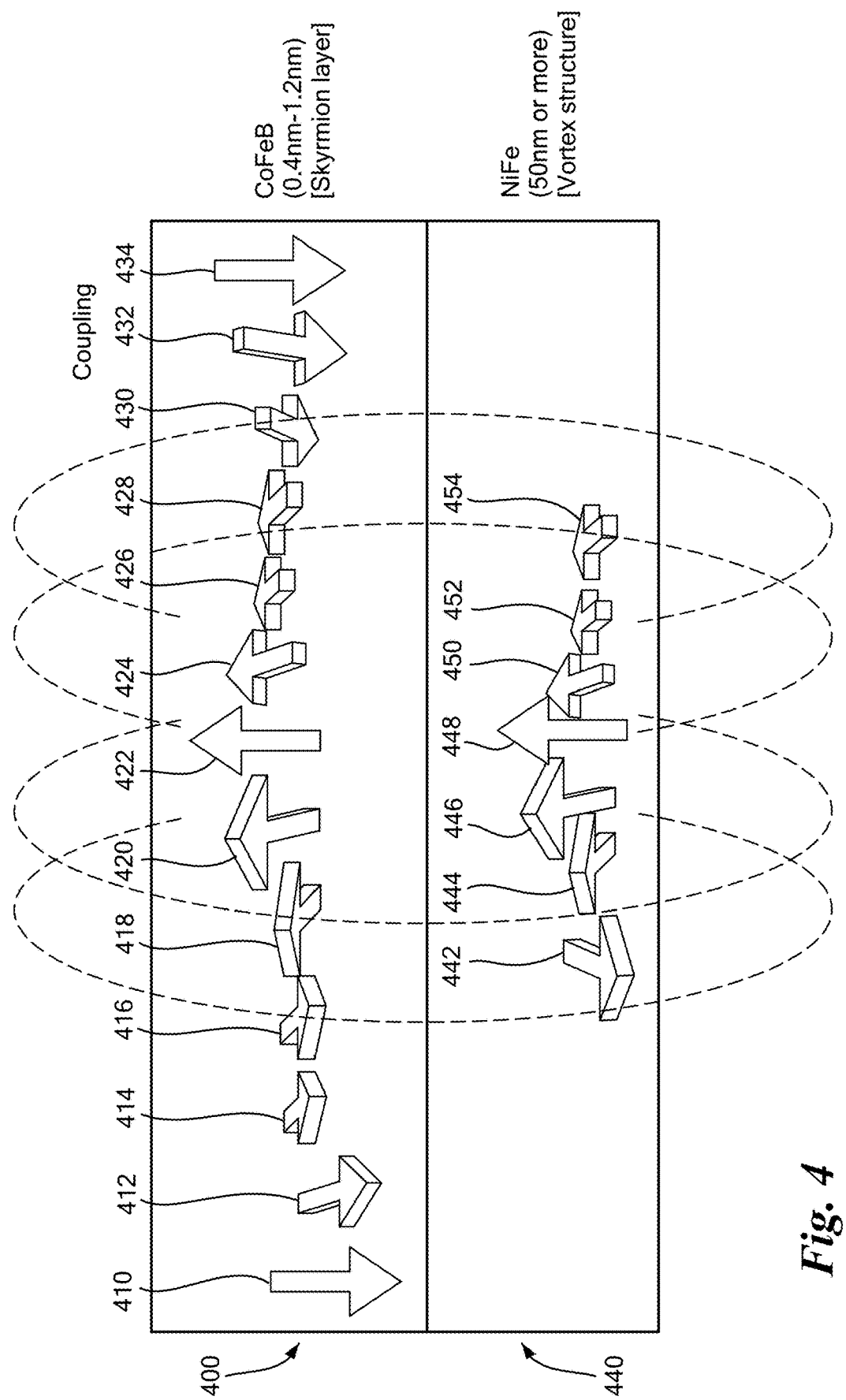
FIG. 4 is a diagram of a coupling between a skyrmion layer and a vortex structure.

Referring to FIG. 4, a skyrmion layer 400 is magnetically coupled to a vortex layer 440. A modulating spacer layer is positioned between the skyrmion layer 400 and the vortex layer 440 magnetically coupling the two to each other. However, the spacer layer is not shown here for ease of reference.

The skyrmion layer 400 contains skyrmions that couple to the magnetic vortex in the vortex layer 440. When a magnetic field is applied to the vortex layer 440 the vortex core will move orthogonally to the direction of the field. The vortex in the vortex layer 440 will be coupled to the skyrmions in the skyrmion layer 400. Accordingly, the magnetization directions 442, 444, 446, 448, 452, 454 of the vortex layer 440 will move according to the magnetization directions 410, 412, 414, 416, 418, 420, 422, 424, 426, 428, 430, 432, 434 of the skyrmion layer 400.

The skyrmion layer 400 may contain Neel skyrmions or Bloch skyrmions, as described in FIG. 3. For example, Bloch skyrmions are shown in FIG. 4. Accordingly, the magnetization directions 410, 412, 414, 416, 418, 420, 422, 424, 426, 428, 430, 432, 434 of the skyrmion layer 400 move out of plane from the edge to the core and couple to the magnetization directions 442, 444, 446, 448, 452, 454 of the vortex layer 440, resulting in said magnetization directions moving out of plane from the edge to the core.

The magnetic coupling between the vortex layer 440 and skyrmion layer 400 will prevent the vortex in the vortex layer 440 from being pinned at the edge. As depicted in FIG. 4, the skyrmions in the skyrmion layer 400 prevent annihilation of a vortex in the vortex layer 440 due to edge defects by repelling the vortex away from the edge. Owing to its unique topological protection given by the skyrmions' geometry and configuration, the magnetic directions of the skyrmions repel away from edges of the free layer. Accordingly, the magnetic directions repel away from the edges of the of the TMR pillar. This helps to prevent or stop all together the increase in coercivity that occurs with small diameter pillars (i.e., pillars less than 1 micron in diameter) and thereby increasing the linear range and accuracy of the TMR.

Roughness around the pillar edge can be a concern with pillars less than 1 micron in diameter. Given the complexities of processing and manufacturing a smooth (a pillar with low roughness) pillar, roughness at the pillar edge may increase as the pillar diameter gets smaller. The imperfections in the roughness along the pillar edge serve as pinning sites that pin or annihilate the vortex causing the coercivity to increase. Accordingly, an increase in roughness along the edge of the pillar causes an increase in coercivity.

Figure 5A:
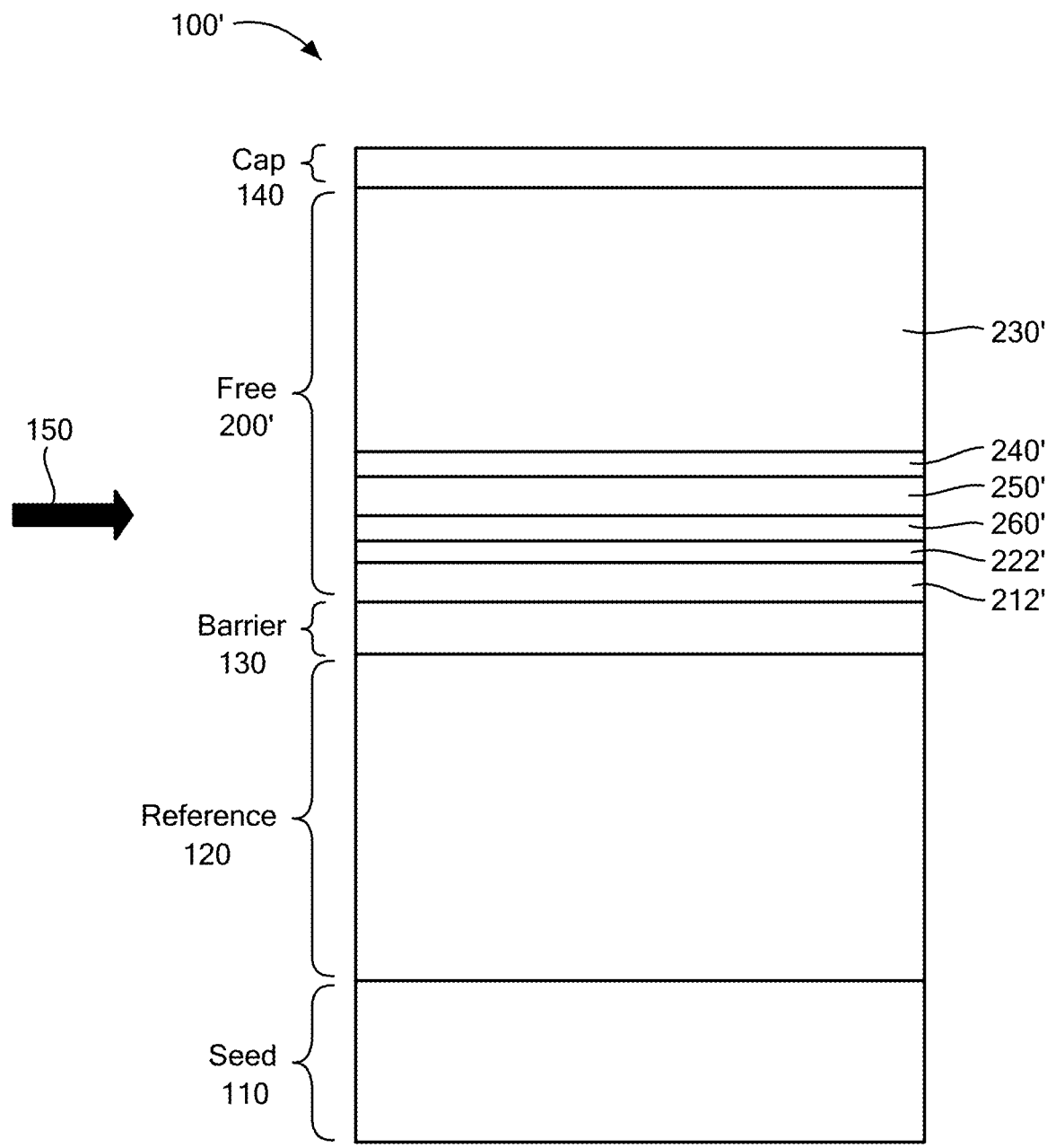
FIG. 5a is a cross-sectional diagram of another example of a TMR element that includes a skyrmion layer and a vortex layer.

Referring to FIG. 5a, an example of a TMR element is a TMR element 100'. TMR element 100' may be similar to TMR element 100 except a free layer 200' is reconfigured compared to the free layer 200 so that a vortex layer 230' is positioned on top of a skyrmion layer 250'. The TMR element 100' may be configured as a single pillar as shown in FIG. 5a or as multiple pillars.

The TMR element 100' includes the seed layer 110; the reference layer 120 on the seed layer 110; the barrier layer 130 on the reference layer 120; the free layer 200' on the barrier layer 130; and the cap layer 140 on the free layer 200'. The free layer 200' includes a ferromagnetic layer 212', a spacer layer 222' on the ferromagnetic layer 212', a heavy metal layer 260' on the spacer layer 222', the skyrmion layer 250' on the heavy metal layer 260', a spacer layer 240' on the skyrmion layer 250', and the vortex layer 230' on the spacer layer 240' magnetically coupled to the skyrmion layer 250'. The ferromagnetic layer 212', the spacer layer 222', the vortex layer 230', the spacer layer 240', the skyrmion layer 250', and the heavy metal layer 260' may be similar to or the same as the corresponding layers in FIG. 1.

Figure 5B:
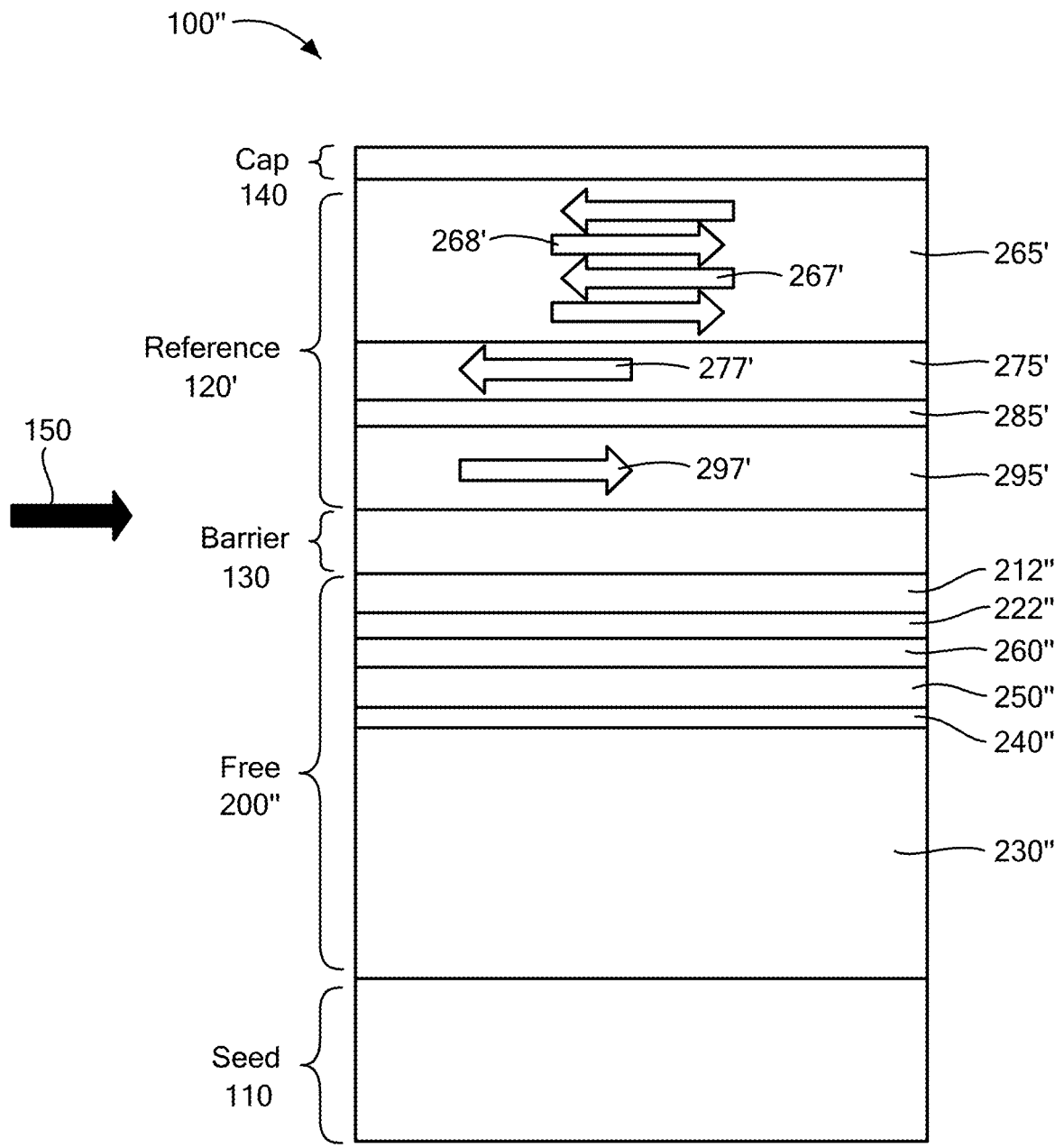
FIG. 5b is a cross-sectional diagram of a further example of a TMR element that includes a skyrmion layer and a vortex layer.

Referring to FIG. 5b, an example of a TMR element is a TMR element 100". TMR element 100" may be similar to TMR element 100 and TMR element 100' except a reference layer 120' is positioned above the barrier layer 130 and a free layer 200''' is positioned below the barrier layer 130. The free layer 200" is an inverted configuration of the free layer 200' (FIG. 5a) so that a skyrmion layer 250" is on top of a vortex layer 230". The TMR element 100" may be configured as a single pillar as shown in FIG. 5b or as multiple pillars.

The TMR element 100' includes the seed layer 110; the free layer 120" on the seed layer 110; the barrier layer 130 on the free layer 200"; the reference layer 120' on the barrier layer 130; and the cap layer 140 on the reference layer 120'.

The free layer 200" includes a spacer layer 240" on the vortex layer 230", a skyrmion layer 250" on the spacer layer 240", a heavy metal layer 260" on the skyrmion layer 250", a spacer layer 222" on the heavy metal layer 260", and a ferromagnetic layer 212" on the spacer layer 222". The ferromagnetic layer 212", the spacer layer 222", the vortex layer 230", the spacer layer 240", the skyrmion layer 250", and the heavy metal layer 260" may be similar to or the same as the corresponding layers in FIG. 1.

The reference layer 120' includes a ferromagnetic layer 295', a spacer layer 285' on top of the ferromagnetic layer 295', a ferromagnetic layer 275' on top of the spacer layer 285', and an antiferromagnetic layer 265' on top of the ferromagnetic layer 275'. The ferromagnetic layer 295', the spacer layer 285', the ferromagnetic layer 275', and the antiferromagnetic layer 265' may be similar to or the same as the corresponding layers in FIG. 1. The antiferromagnetic layer 265' includes magnetization directions 267', 268' that are antiparallel to each other. The ferromagnetic layer 275' has a magnetization direction 277', that is pinned by the antiferromagnetic layer 265'. The ferromagnetic layer 295' has a magnetization direction 297' and is the reference direction of the TMR element 100". The magnetization direction 297' may be parallel or antiparallel to the magnetization direction 277' depending on the thickness of the spacer layer 285'.

Figure 5C:
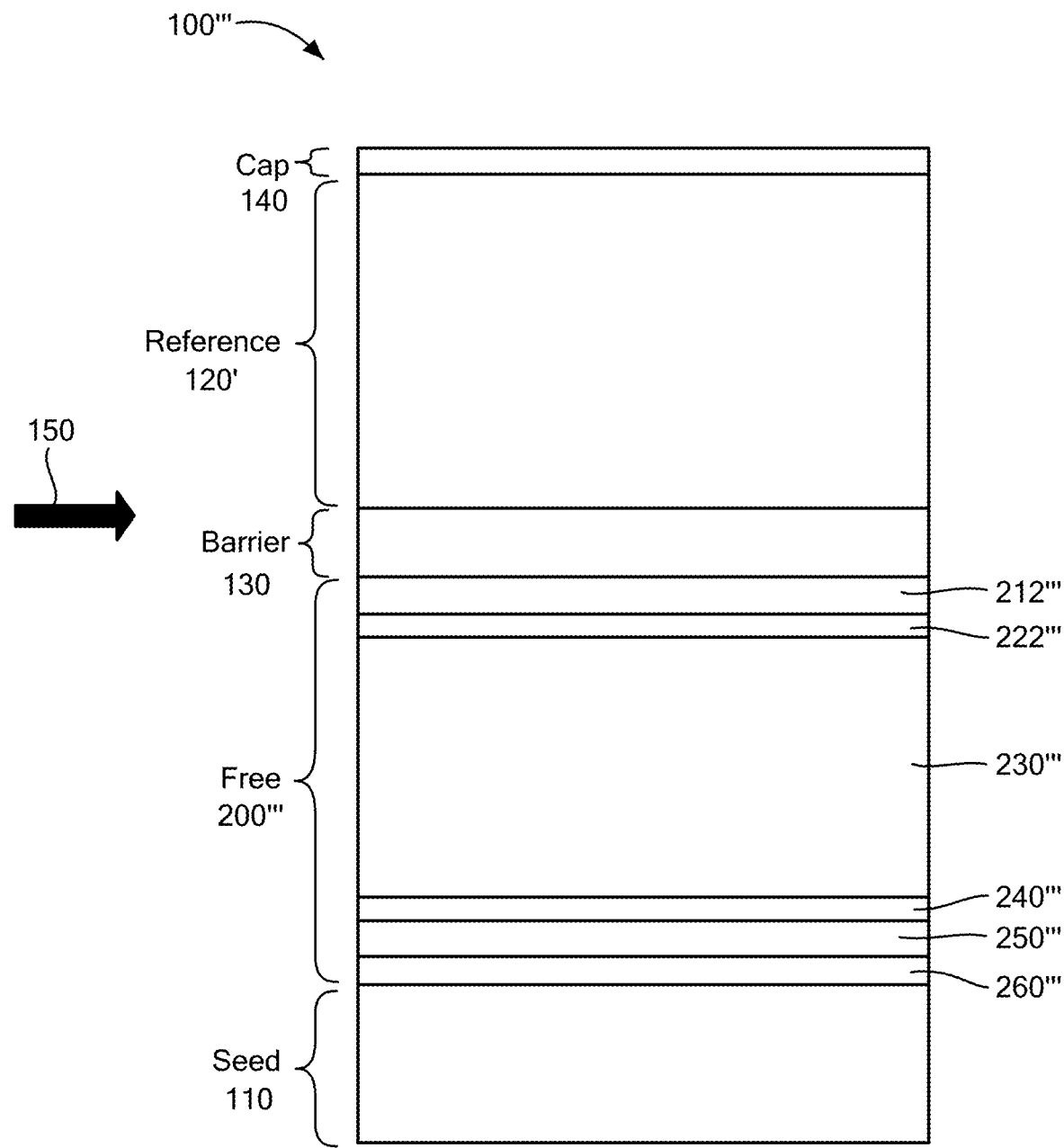
FIG. 5c is a cross-sectional diagram of a still further example of a TMR element that includes a skyrmion layer and a vortex layer.

Referring to FIG. 5c, an example of a TMR element is a TMR element 100'''. TMR element 100''' may be similar TMR element 100" except a free layer 200''' is an inverted configuration of the free layer 200 (FIG. 1) so that a vortex layer 230''' is positioned on top of a skyrmion layer 250'''. The TMR element 100" may be configured as a single pillar as shown in FIG. 5c or as multiple pillars.

The TMR element 100' includes the seed layer 110; the free layer 120''' on the seed layer 110; the barrier layer 130 on the free layer 200'''; the reference layer 120' on the barrier layer 130; and the cap layer 140 on the reference layer 120'. The free layer 200" includes a heavy metal layer 260''', a skyrmion layer 250''' on the heavy metal layer 260''', a spacer layer 240''' on the skyrmion layer 250''', a vortex layer 230''' on the spacer layer 240''', a spacer layer 222''' on the vortex layer 230''' and a ferromagnetic layer 212''' on the spacer layer 222'''. The ferromagnetic layer 212''', the spacer layer 222''', the vortex layer 230''', the spacer layer 240''', the skyrmion layer 250''', and the heavy metal layer 260''' may be similar to or the same as the corresponding layers in FIG. 1.

The TMR elements described herein may be placed in bridges for use in a magnetic-field sensor. As used herein, the term "magnetic-field sensor" is used to describe a circuit that uses a magnetic field sensing element, generally in combination with other circuits. Magnetic-field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic-field sensor is used in combination with a back-biased or other magnet, and a magnetic-field sensor that senses a magnetic-field density of a magnetic field.

The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

References in the specification to "one embodiment, "an embodiment," "an example embodiment," etc., indicate that the embodiment described can include a particular feature, structure, or characteristic, but every embodiment can include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal, "top," "bottom," and derivatives thereof shall relate to the described structures and methods, as oriented in the drawing figures. The terms "overlying," "atop," "on top, "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary elements.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter.

What is claimed is:

1. A magnetoresistance (MR) element, comprising:
   a free layer comprising:
      a vortex layer comprising a vortex; and
      a skyrmion layer magnetically coupled to the vortex layer,
   wherein the skyrmion layer is configured to form skyrmions that reduce annihilation of the vortex thereby increasing a linear response range of the MR element.

2. The MR element of claim 1, wherein the MR element is a tunneling magnetoresistance (TMR) element or a giant magnetoresistance (GMR) element.

3. The MR element of claim 1, further comprising a barrier layer,
   wherein the vortex layer is closer to the barrier layer than the skyrmion layer.

4. The MR element of claim 1, further comprising a barrier layer,
   wherein the skyrmion layer is closer to the barrier layer than the vortex layer.

5. The MR element of claim 1, further comprising:
   a barrier layer;
   a seed layer;
   a cap layer; and a reference layer located between the seed layer and the barrier layer,
wherein the free layer is located between the cap layer and the barrier layer.

6. The MR element of claim 1, further comprising:
a barrier layer;
a seed layer; and
a cap layer; and
a reference layer located between the cap layer and the barrier layer,
wherein the free layer is located between the seed layer and the barrier layer.

7. The MR element of claim 1, wherein the MR element is a pillar with a diameter less than 1 micron.

8. The MR element of claim 1, wherein the vortex layer is a ferromagnetic material.

9. The MR element of claim 8, wherein the ferromagnetic material is nickel iron having a thickness greater than 50 nanometers.

10. The MR element of claim 1, wherein the skyrmion layer is a ferromagnetic material.

11. The MR element of claim 10, wherein the ferromagnetic material comprises a cobalt element, and
wherein the ferromagnetic material has a thickness between 0.4 nanometers to 1.2 nanometers.

12. The MR element of claim 1, wherein a thickness of the skyrmion layer is within a spin-reorientation transition (SRT) of the skyrmion layer.

13. The MR element of claim 1, wherein the free layer further comprises a spacer layer between the vortex layer and the skyrmion layer, and
wherein the spacer layer is configured to enable magnetically coupling of the vortex layer with the skyrmion layer.

14. The MR element of claim 13, wherein the spacer layer is a metallic material.

15. The MR element of claim 14, wherein the metallic material is tantalum having a thickness between 0.1 nanometers to 1.1 nanometers.

16. The MR element of claim 13, wherein the free layer further comprises a heavy metal layer disposed on the skyrmion layer.

17. The MR element of claim 16, wherein the heavy metal layer is tungsten, platinum, iridium and/or tantalum having a thickness greater than 5 nanometers.

18. The MR element of claim 1, wherein the skyrmion layer is a Néel skyrmion or a Bloch skyrmion.

19. The MR element of claim 1, wherein the free layer further comprises:
a first spacer layer between the vortex layer and the skyrmion layer;
a heavy metal layer disposed on the skyrmion layer;
a ferromagnetic layer below the vortex layer; and
a second spacer layer between the vortex layer and the ferromagnetic layer,
wherein the first spacer layer is configured to enable magnetically coupling of the vortex layer with the skyrmion layer.

20. The MR element of claim 19, wherein the ferromagnetic layer is configured to form skyrmions that reduce annihilation of the vortex thereby increasing a linear response range of the MR element.

21. The MR element of claim 20, wherein the ferromagnetic layer is cobalt iron boron having a thickness of about 2.0 nanometers.

22. The MR element of claim 19, further comprising:
a reference layer; and
an insulating layer between the reference layer and the free layer.

23. The MR element of claim 1, wherein response to an applied external magnetic field at least one magnetization direction of the vortex moves in the same magnetization direction as at least one magnetization direction of the skyrmion layer.

24. The MR element of claim 1, wherein the vortex has a core area and an edge area, wherein at least one magnetization direction of the vortex moves in the same magnetization direction across the core area and the edge area.

25. The MR element of claim 1, wherein the vortex has a core area and an edge area, wherein at least one magnetization direction of the vortex moves in different magnetization directions in the core area and the edge area and in a magnetization direction away from the edge area.

26. A magnetic field sensor comprising:
a bridge comprising at least one MR element,
wherein the at least one MR element comprises:
a free layer comprising:
a vortex layer comprising a vortex; and
a skyrmion layer on the vortex layer and magnetically coupled to the vortex layer, and
wherein the skyrmion layer is configured to form skyrmions that reduce annihilation of the vortex thereby increasing a linear response range of the at least one MR element.

27. The magnetic field sensor of claim 26, wherein the MR element is a tunneling magnetoresistance (TMR) element or a giant magnetoresistance (GMR) element.

28. The magnetic field sensor of claim 26, further comprising a barrier layer, wherein the vortex layer is closer to the barrier layer than the skyrmion layer.

29. The magnetic field sensor of claim 26, further comprising a barrier layer, wherein the skyrmion layer is closer to the barrier layer than the vortex layer.

30. The magnetic field sensor of claim 26, further comprising:
a barrier layer;
a seed layer; and
a cap layer; and
a reference layer located between the seed layer and the barrier layer,
wherein the free layer is located between the cap layer and the barrier layer.

31. The magnetic field sensor of claim 26, further comprising:
a barrier layer;
a seed layer; and
a cap layer; and
a reference layer located between the cap layer and the barrier layer,
wherein the free layer is located between the seed layer and the barrier layer.

32. The magnetic field sensor of claim 26, wherein the MR element is a pillar with a diameter less than 1 micron.

33. The magnetic field sensor of claim 26, wherein the vortex layer is a ferromagnetic material, wherein the ferromagnetic material is nickel iron having a thickness greater than 50 nanometers.

34. The magnetic field sensor of claim 26, wherein the skyrmion layer is a ferromagnetic material, wherein the ferromagnetic material comprises a cobalt element and a thickness between 0.4 nanometers to 1.2 nanometers.

35. The magnetic field sensor of claim 34, wherein a thickness of the skyrmion layer is within a spin-reorientation transition (SRT) of the skyrmion layer.

36. The magnetic field sensor of claim 26, wherein the free layer further comprises a spacer layer between the vortex layer and the skyrmion layer, and
  wherein the spacer layer is configured to enable magnetic coupling of the vortex layer with the skyrmion layer.

37. The magnetic field sensor of claim 36, wherein the spacer layer is a metallic material, wherein the metallic material is tantalum having a thickness between 0.1 nanometers to 1.1 nanometers.

38. The magnetic field sensor of claim 26, wherein the free layer further comprises a heavy metal layer disposed on the skyrmion layer, wherein the heavy metal layer is tungsten, platinum, iridium and/or tantalum having a thickness greater than 5 nanometers.

39. A method comprising:
  manufacturing a magnetoresistance (MR) element, the manufacturing comprising:
  forming a free layer, comprising:
    depositing a vortex layer comprising a vortex; and
    depositing a skyrmion layer on the vortex layer that is magnetically coupled to the vortex layer,
  wherein the skyrmion layer is configured to form skyrmions that reduce annihilation of the vortex thereby increasing a linear response range of the MR element.

40. The method of claim 39, wherein manufacturing the MR element comprises manufacturing the MR element as a tunneling magnetoresistance (TMR) element or a giant magnetoresistance (GMR) element.

41. The method of claim 39, further comprising forming a barrier layer, wherein the vortex layer is closer to the barrier layer than the skyrmion layer.

42. The method of claim 39, further comprising forming a barrier layer, wherein the skyrmion layer is closer to the barrier layer than the vortex layer.

43. The method of claim 39, further comprising:
  forming a barrier layer;
  forming a seed layer;
  forming a cap layer; and
  forming a reference layer between the seed layer and the barrier layer,
  wherein forming the free layer comprises forming the free layer between the cap layer and the barrier layer.

44. The method of claim 39, further comprising:
  forming a barrier layer;
  forming a seed layer;
  forming a cap layer; and
  forming a reference layer between the cap layer and the barrier layer,
  wherein forming the free layer comprises forming the free layer between the seed layer and the barrier layer.

45. The method of claim 39, wherein manufacturing the MR element comprises manufacturing the MR element as a pillar with a diameter less than 1 micron.

46. The method of claim 39, wherein depositing the vortex layer comprises depositing nickel iron having a thickness greater than 50 nanometers.

47. The method of claim 39, wherein depositing the skyrmion layer comprises depositing a ferromagnetic material comprising a cobalt element having a thickness between 0.4 nanometers to 1.2 nanometers.

48. The method of claim 39, wherein depositing the skyrmion layer comprises depositing the skyrmion layer with a thickness within a spin-reorientation transition (SRT) of the skyrmion layer.

49. The method of claim 39, wherein the forming the free layer further comprises depositing a spacer layer between the vortex layer and the skyrmion layer, and
  wherein the spacer layer is configured to enable magnetic coupling of the vortex layer with the skyrmion layer.

50. The method of claim 49, wherein depositing the spacer layer comprises depositing tantalum having a thickness between 0.1 nanometers to 1.1 nanometers.

51. The method of claim 39, wherein forming the free layer further comprises depositing tungsten, platinum, iridium and/or tantalum having a thickness greater than 5 nanometers.

* * * * *